United States Patent
Russell

(10) Patent No.: US 11,729,939 B2
(45) Date of Patent: Aug. 15, 2023

(54) SELF LATCHING COOLING ASSEMBLY

(71) Applicant: Seagate Technology LLC, Cupertino, CA (US)

(72) Inventor: Michael J. Russell, Longmont, CO (US)

(73) Assignee: Seagate Technology LLC, Fremont, CA (US)

( * ) Notice: Subject to any disclaimer, the term of this patent is extended or adjusted under 35 U.S.C. 154(b) by 671 days.

(21) Appl. No.: 16/785,216

(22) Filed: Feb. 7, 2020

(65) Prior Publication Data
US 2021/0251103 A1    Aug. 12, 2021

(51) Int. Cl.
*H05K 7/20* (2006.01)
*F04D 29/60* (2006.01)
*H05K 7/14* (2006.01)

(52) U.S. Cl.
CPC ....... *H05K 7/20154* (2013.01); *F04D 29/603* (2013.01); *H05K 7/1415* (2013.01); *H05K 7/2049* (2013.01); *H05K 7/20172* (2013.01)

(58) Field of Classification Search
CPC ............. H05K 7/20154; H05K 7/1415; H05K 7/20172; H05K 7/2049; F04D 29/603; F04D 29/601; F04D 25/166; G11B 33/1413
USPC ........................................................ 454/184
See application file for complete search history.

(56) References Cited

U.S. PATENT DOCUMENTS

| | | | |
|---|---|---|---|
| 5,828,646 A | 10/1998 | Jones | |
| 6,435,889 B1* | 8/2002 | Vinson | H01R 13/745 439/247 |
| 7,344,394 B1 | 3/2008 | Barina et al. | |
| 9,668,383 B2 | 5/2017 | Cox et al. | |
| 10,462,933 B2 | 10/2019 | Milligan et al. | |
| 2003/0035724 A1* | 2/2003 | Chen | F04D 29/646 415/213.1 |
| 2003/0227757 A1* | 12/2003 | Vincent | H05K 7/20172 361/796 |
| 2007/0140787 A1 | 6/2007 | Champion et al. | |
| 2012/0027580 A1* | 2/2012 | Lu | F04D 25/0613 415/214.1 |
| 2015/0351280 A1* | 12/2015 | Gonzalez Inda | G06F 1/181 415/126 |
| 2016/0174409 A1* | 6/2016 | Mease | H05K 7/20172 361/695 |

* cited by examiner

*Primary Examiner* — Anatoly Vortman
*Assistant Examiner* — Zhengfu J Feng
(74) *Attorney, Agent, or Firm* — Faegre Drinker Biddle & Reath

(57) ABSTRACT

A cooling assembly includes a panel defining an opening, a cooling unit including an output and coupled to the panel such that the output at least partially covers the opening of the panel, and spring-loaded latch assemblies coupled to the panel and configured to couple the cooling assembly to an enclosure.

18 Claims, 11 Drawing Sheets

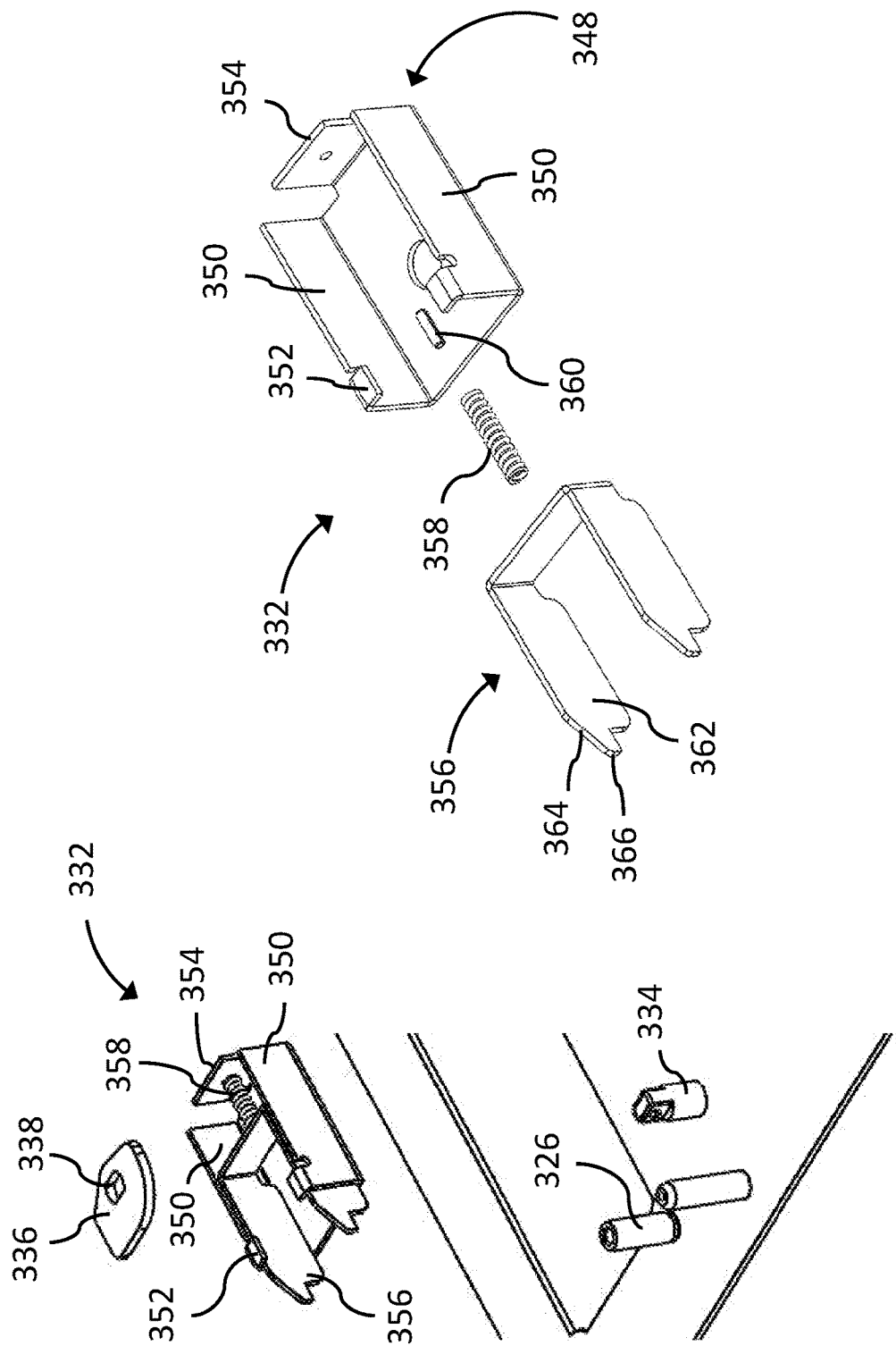

SELF LATCHING COOLING ASSEMBLY

SUMMARY

In certain embodiment, a cooling assembly includes a panel defining an opening, a cooling unit including an output and coupled to the panel such that the output at least partially covers the opening of the panel, and spring-loaded latch assemblies coupled to the panel and configured to couple the cooling assembly to an enclosure.

In certain embodiments, a system includes an enclosure including a wall with mounting openings therethrough and cooling assemblies removably coupled to the wall. Each cooling assembly includes a panel defining an opening, a cooling unit with an output and coupled to the panel such that the output at least partially covers the opening of the panel, and a handle extending through a hole in the panel and rotatable to latch and unlatch respective cooling assemblies to and from the wall of the enclosure.

In certain embodiments, a method of coupling and/or uncoupling a cooling assembly to a wall of an enclosure is disclosed. The enclosure includes a mounting opening, and the cooling assembly includes a panel, a cooling unit coupled to the panel, and latch assemblies coupled to the panel and each including a latch slide and a spring. The method includes inserting the cooling assembly through the mounting opening such that a surface of each latch slide contacts a side of the mounting opening and compresses each spring of the latch assemblies as the cooling assembly is inserted. The method further includes securing the cooling assembly to the enclosure by further inserting the cooling assembly through the mounting opening such that the latch slide is inserted past the wall and the spring causes the latch slide to slide so that the wall is positioned between the latch slide and the panel.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

BRIEF DESCRIPTION OF THE DRAWINGS

FIGS. 8 and 9 show partially exploded, perspective views of a latch assembly, in accordance with certain embodiments of the present disclosure.

Figure 1:
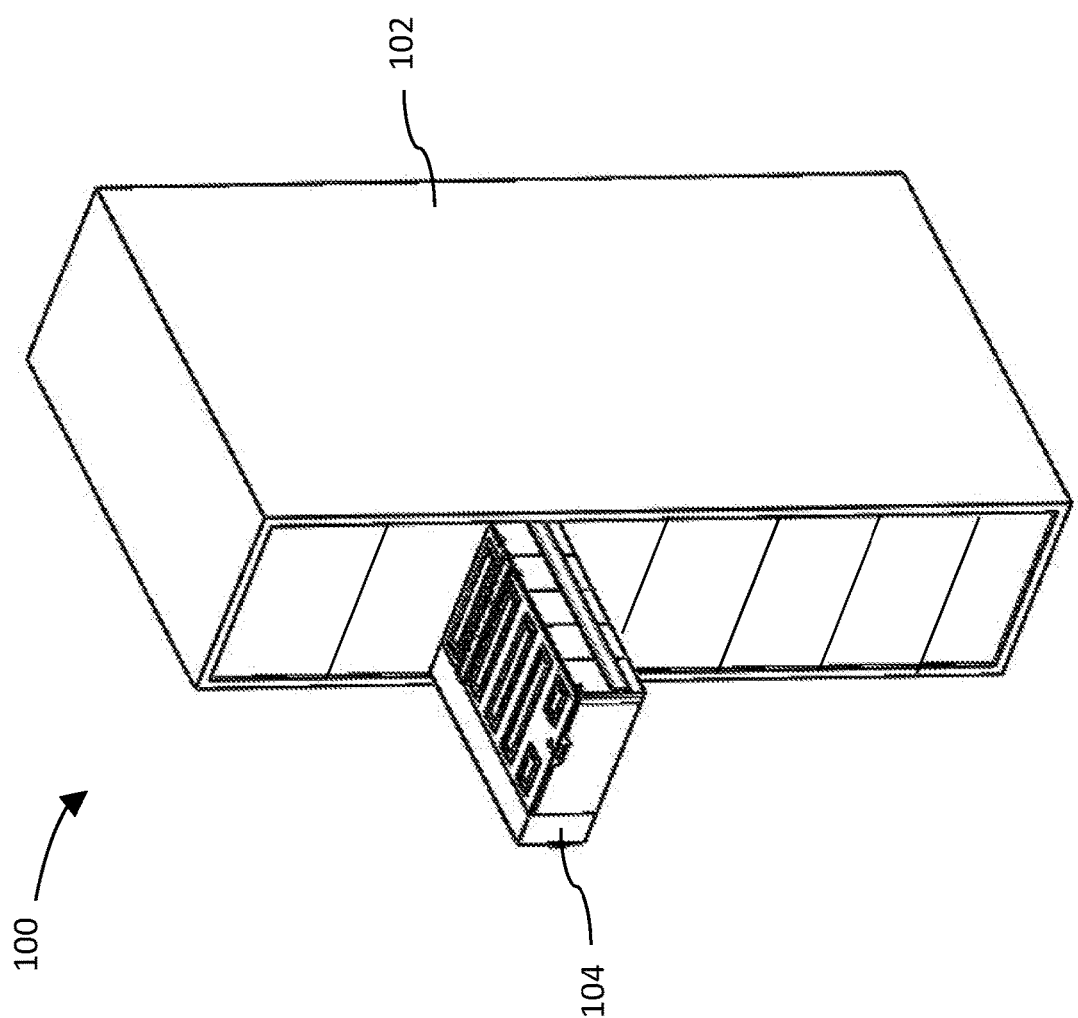
FIG. 1 shows a perspective view of a storage system, in accordance with certain embodiments of the present disclosure.

While the disclosure is amenable to various modifications and alternative forms, specific embodiments have been shown by way of example in the drawings and are described in detail below. The intention, however, is not to limit the disclosure to the particular embodiments described but instead is intended to cover all modifications, equivalents, and alternatives falling within the scope the appended claims.

DETAILED DESCRIPTION

Data storage systems utilize cooling devices such as air movers (e.g., fans or blowers) to keep components of the data storage systems within a desired operating range. When one of the air movers fails, the total volume of air flow is reduced. If the failed air mover is not replaced quickly, it less likely that the desired temperature range is maintained. Removing and installing air movers in a data storage system typically requires tools and/or various fasteners (e.g., screws) to detach or attach panels of the data storage system or the air movers themselves. Certain embodiments of the present disclosure are accordingly directed to approaches for toolless installation and removal of air movers in a data storage system.

FIG. 1 shows a data storage system 100 including a rack 102 (e.g., a cabinet) with a plurality of enclosures 104. Each enclosure 104 can include multiple drawers or storage levels (each of which may be considered separate enclosures or sub-enclosures) that house electronic devices such as data storage devices installed within the drawers or storage levels. Each enclosure 104 itself can be arranged in a drawer-like fashion to slide into and out of the rack 102, although the enclosures 104 are not necessarily arranged as such.

Figure 2:
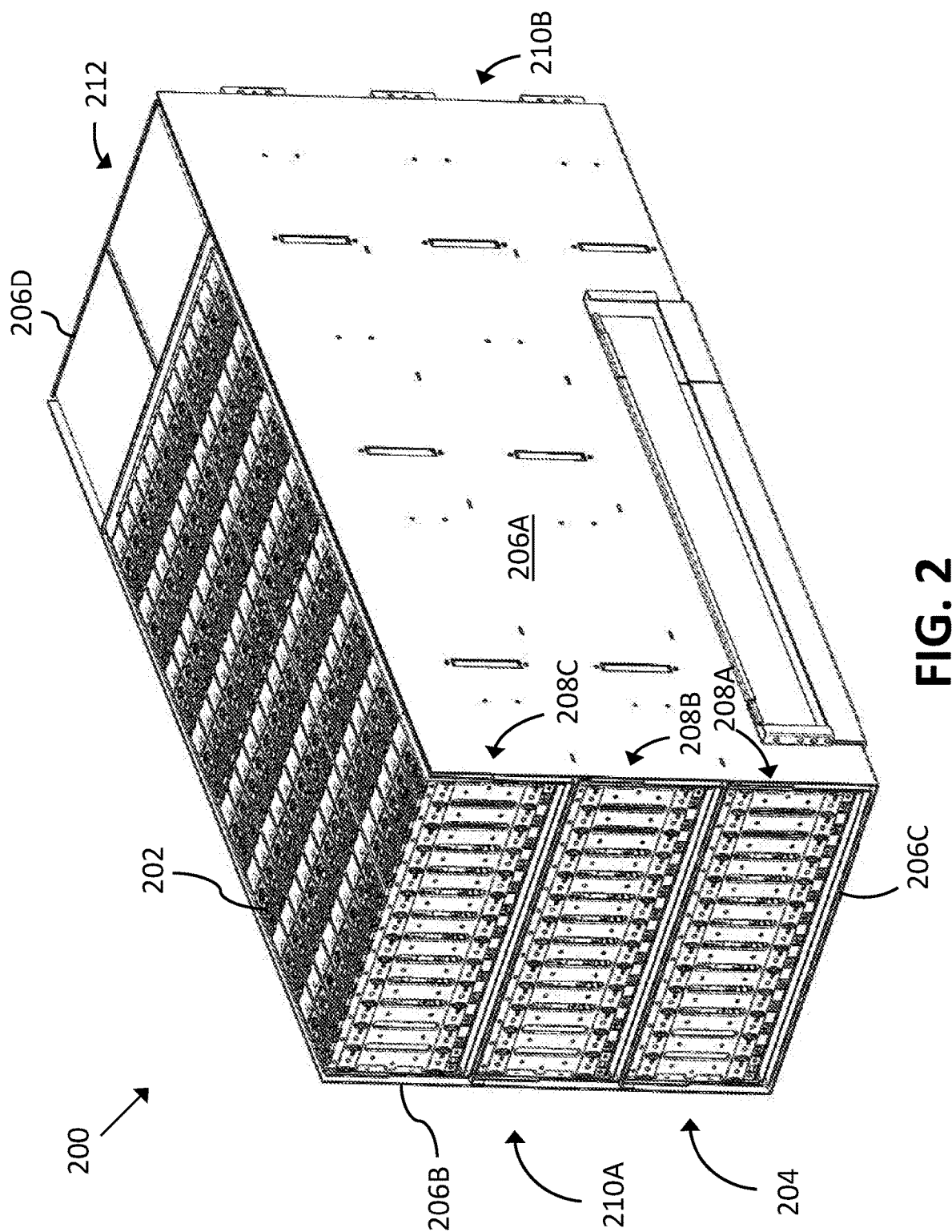
FIG. 2 shows a perspective view of an enclosure, in accordance with certain embodiments of the present disclosure.

FIG. 2 shows an enclosure 200, which can be utilized in a data storage system such as the data storage system 100 of FIG. 1. For example, a rack—such as the rack 102 in FIG. 1—can include multiple individual enclosures, such as the enclosure 200. The enclosure 200 is arranged to secure data storage devices 202 (e.g., hard disk drives and/or solid state drives), various electronics (e.g., power supplies), and cooling devices (e.g., air movers) among other things.

Figure 3:
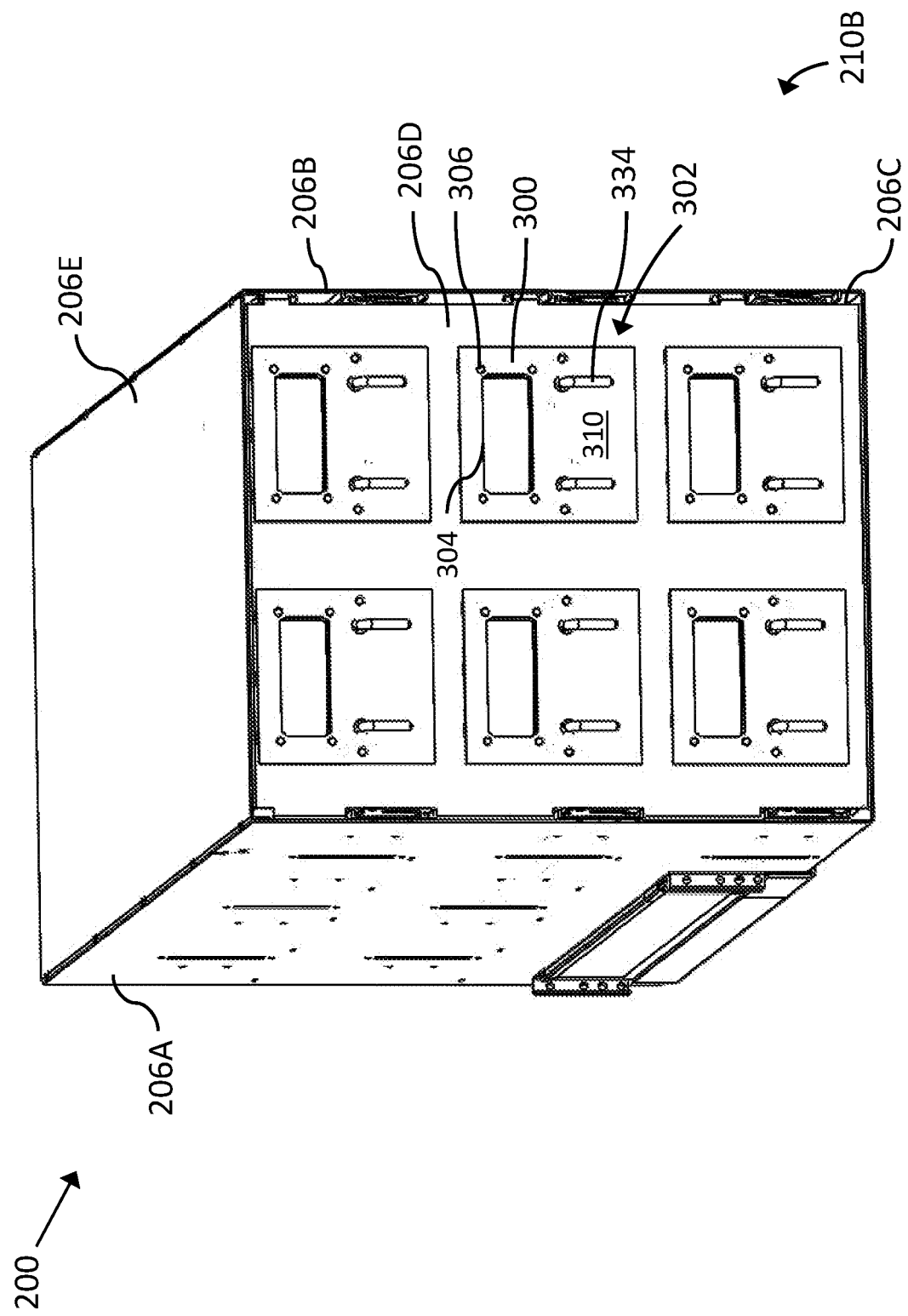
FIG. 3 shows a perspective view of a back end of the enclosure of FIG. 2, in accordance with certain embodiments of the present disclosure.

The enclosure 200 includes a chassis 204 with a first side wall 206A, a second side wall 206B, a bottom wall 206C, a back wall 206D, and a top cover 206E (shown in FIG. 3). The chassis 204 may also include front wall to enclose the data storage devices 202 within the enclosure 200. As shown in FIG. 2, the enclosure 200 can include multiple data storage levels 208A-C each with multiple rows of data storage devices 202. Each data storage level 208A-C may be arranged to slide into and out of the enclosure 200 in a drawer-like fashion. Further, each data storage level 208A-C can form its own enclosure such that the enclosure 200 can be considered to include multiple, smaller enclosures arranged to slide into and out of the enclosure 200. The enclosure 200 includes a front end 210A and a back end 210B with a cooling area 212 at the back end 210B of the enclosure 200.

Figure 4:
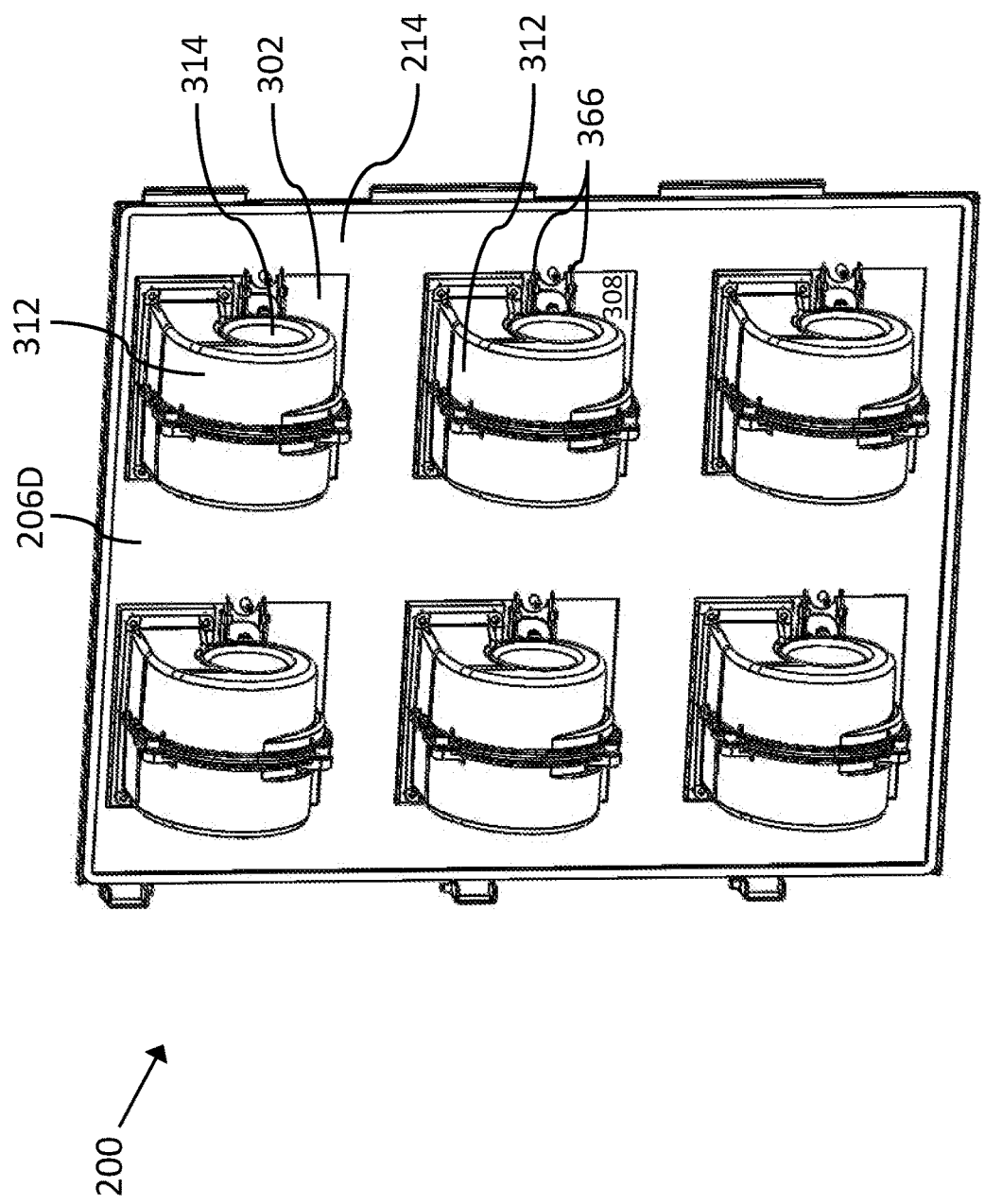
FIG. 4 shows a perspective view of a back wall of the enclosure of FIGS. 2 and 3, in accordance with certain embodiments of the present disclosure.
Figure 5:
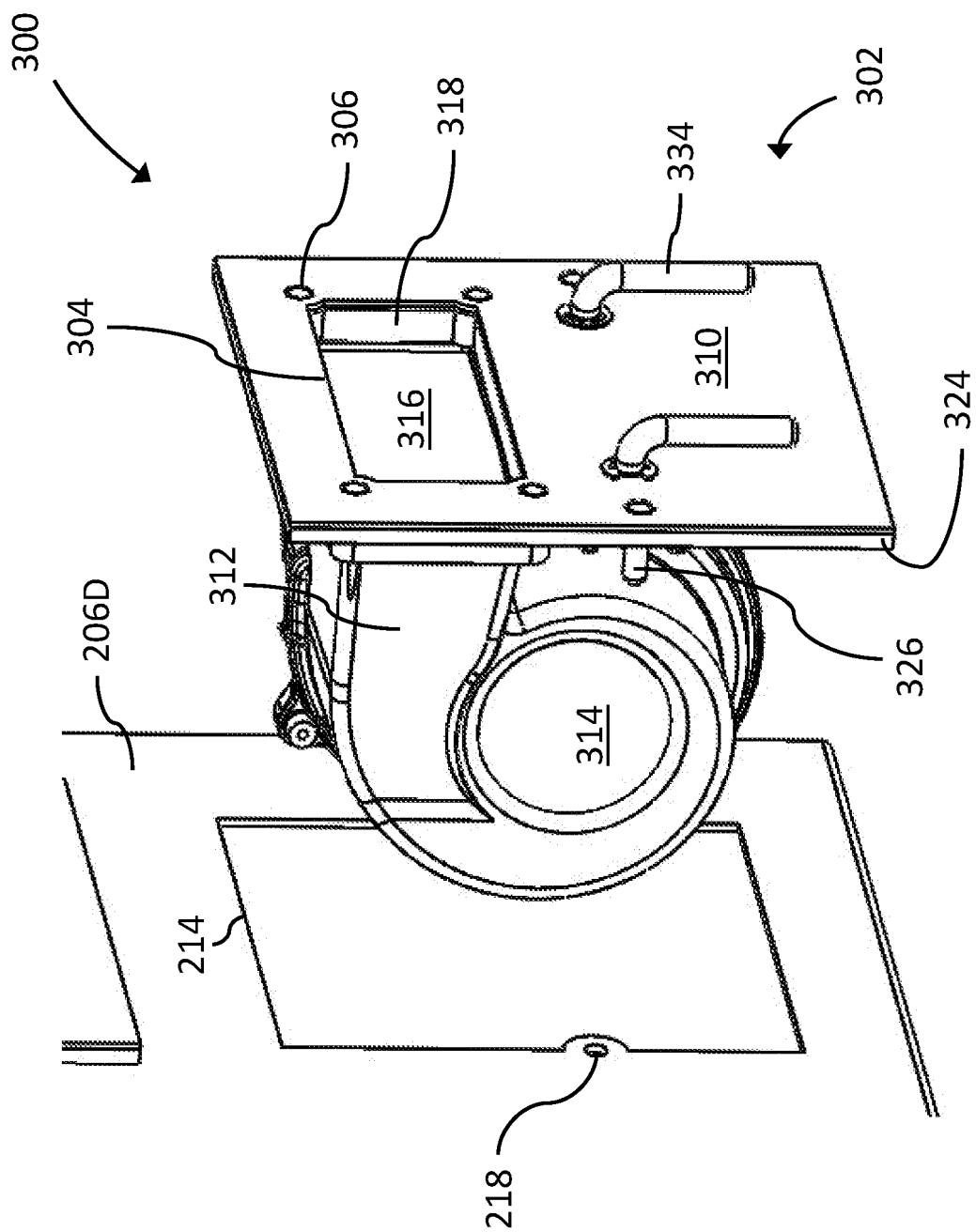
FIG. 5 shows a perspective view of a cooling assembly, in accordance with certain embodiments of the present disclosure.

FIG. 3 shows the back end 210B of the enclosure 200 and cooling assemblies 300 coupled to the enclosure 200. FIG. 4 shows the back end 210B of the enclosure 200 as seen from inside the enclosure 200. And, FIG. 5 shows one of the cooling assemblies 300 before being coupled to the enclosure 200. Although six cooling assemblies 300 are shown as being coupled to the enclosure 200, fewer or more cooling assemblies 300 can be used. As will be described in more detail below, the cooling assemblies 300 can be uncoupled and replaced by new cooling assemblies 300 without requiring tools such as screwdrivers, drills, etc. As such, the cooling assemblies 300 can be replaced quickly in the event of failure to reduce disruption of air flow. During operation, the cooling assemblies 300 are arranged to pull air from the front end 210A of the enclosure 200 towards the back end 210B of the enclosure 200. As the air moves within the enclosure 200, the air cools the various electronic devices positioned within the enclosure 200.

The cooling assemblies 300 each include a panel 302 with an opening 304. The panel 302 also includes mounting holes 306 positioned around a periphery of the opening 304 and along a periphery of the panel 302. The panel 302 includes an interior-facing surface 308 and an exterior-facing surface 310. The panel 302 can be shaped and sized to be larger than mounting openings 214 (shown in FIG. 4) in the back wall 206D of the enclosure 200. As such, when the cooling assemblies 300 are coupled to the back wall 206D of the enclosure 200, the panels 302 of the cooling assemblies 300 are positioned outside the enclosure 200 while other parts of the cooling assemblies 300 are positioned in the interior of the enclosure 200.

Figure 6:
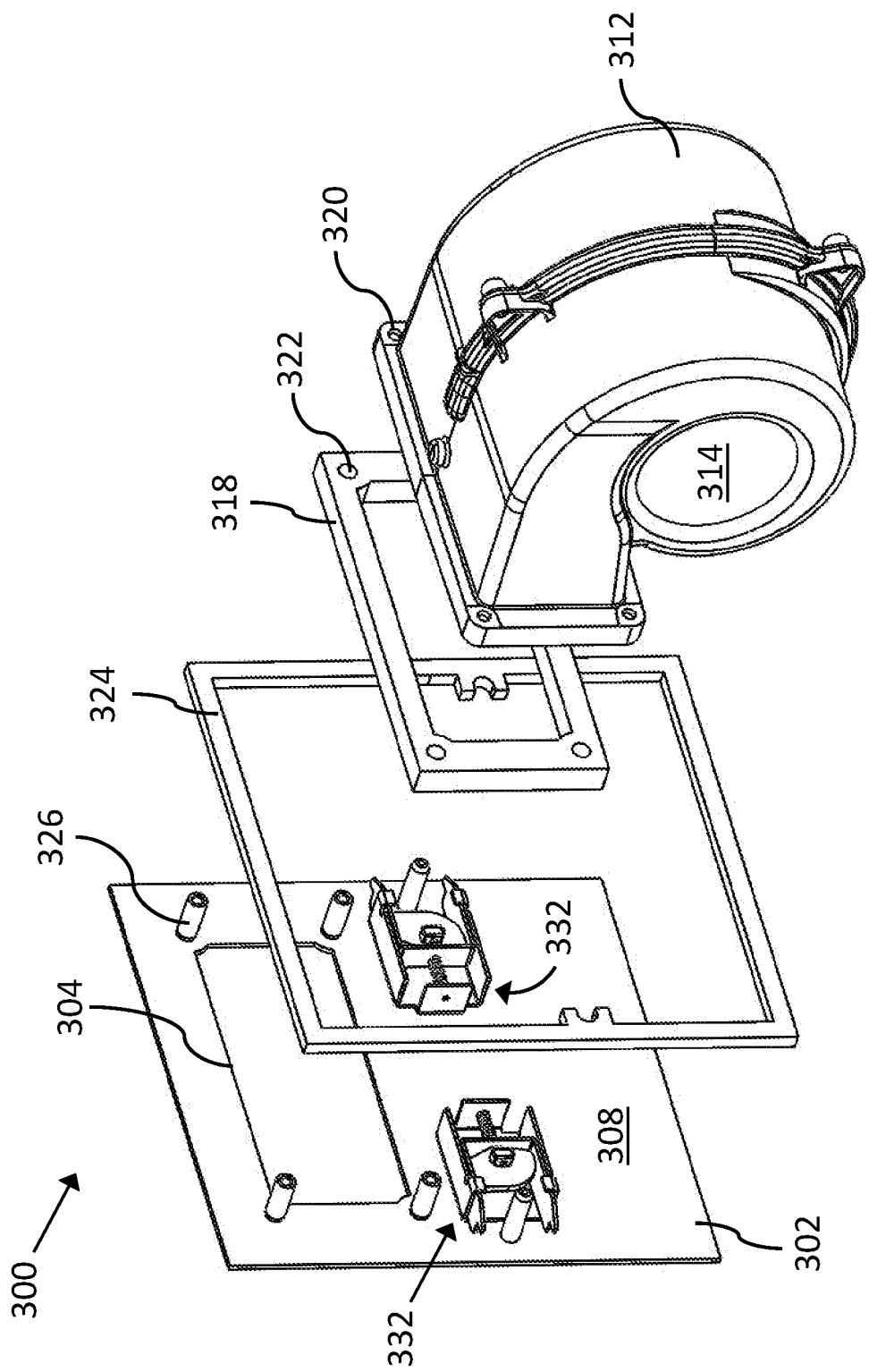
FIGS. 6 and 7 show partially exploded, perspective views of the cooling assembly of FIG. 5, in accordance with certain embodiments of the present disclosure.

As shown in FIGS. 4-6, the cooling assemblies 300 include a cooling unit 312 (e.g., a blower, a fan module) that is coupled to the panel 302 (e.g., via fasteners). The cooling unit 312 includes at least one input 314 and at least one output 316. When the cooling unit 312 is operating, a motor rotates impellers or blades such that air is exhausted pulled into the input 314 and exhausted through the output 316. The cooling unit 312 is coupled to the panel 302 such the output 316 of the cooling unit 312 at least partially covers the opening 304 of the panel 302. As shown in FIG. 4, the cooling unit 312 is coupled to the interior-facing surface 308 of the panel 302. In certain embodiments, as shown in FIGS. 4-6, the cooling unit 312 is a blower (e.g., a centrifugal blower with multiple inputs 314) as opposed to a fan (e.g., an axial fan). Blowers can provide certain advantages over fans such as being more power efficient and less susceptible to allowing air to flow in a reverse direction (e.g., back flow) when the blower has malfunctioned.

As shown in FIG. 6, in certain embodiments, the cooling assembly 300 includes a gasket 318 that can be coupled between the panel 302 and the cooling unit 312. The gasket 318 can surround the periphery of the opening 304 of the panel 302 as well as the output 316 of the cooling unit 312. The gasket 318 can provide a seal such that air does not leak out of or into the enclosure 200 between the panel 302 and the cooling unit 312. Further, the gasket 318 can absorb or otherwise reduce vibration induced by the cooling unit 312 to the panel 302.

As shown in FIG. 6, the cooling unit 312 can include mounting openings 320 and the gasket 318 can also include mounting openings 322. Fasteners (e.g., screws, clips, pins, fastening dampers, and the like) can extend through the respective mounting openings 320 and 322. For example, the panel 302 could include pins that extend from the interior-facing surface 308 and extend through the respective mounting openings 320 and 322.

As shown in FIG. 6, in certain embodiments, the cooling assembly 300 includes another gasket 324 that is sized to surround a periphery of the panel 302. When the cooling assembly 300 is coupled to the enclosure 200, the gasket 324 can be coupled between the panel 302 and the enclosure 200. The gasket 324 can provide a seal such that air does not leak out of or into the enclosure 200 between the panel 302 and the enclosure 200. Further, the gasket 324 can absorb or otherwise reduce vibration induced by the cooling unit 312 to the enclosure 200. As such, the two gaskets 318 and 324 together can reduce the amount of vibration transferred from the cooling unit 312 to the rest of the enclosure 200.

Also shown in FIG. 6 are guide pins 326 that are coupled to the interior-facing surface 308 of the panel 302. The guide pins 326 help when coupling the cooling assembly 300 to the enclosure 200. For example, the back wall 206D of the enclosure 200 can include guide holes 218 (one of which is shown in FIG. 5) that correspond to each of the guide pins 326 of the cooling assembly 300. The guide pins 326 can extend through the guide holes 218 as the cooling assembly 300 is being positioned on and coupled to the enclosure 200. In certain embodiments, at least part of the guide pins 326 extend through holes in the panel 302. In certain embodiments, the guide pins 326 are press fit into a hole or recess in the panel 302.

As shown in FIG. 6, the cooling assemblies 300 include one or more latch assemblies 332 that are coupled to the panel 302 on the interior-facing surface 308. As will be described in more detail below, the latch assemblies 332 are arranged to and include components that assist in coupling the cooling assemblies 300 to a wall (e.g., the back wall 206D) of the enclosure 200 and uncoupling the cooling assemblies 300 from the wall. Using the latch assemblies 332, the cooling assemblies 300 can couple to the enclosure 200 without using separate tools, and the cooling assemblies 300 can provide a seal between the cooling assemblies and the enclosure 200. Although only two latch assemblies 332 are shown in FIG. 6, the cooling assemblies 300 can include additional latch assemblies 332. In certain embodiments, as shown in FIG. 6, the latch assemblies 332 are positioned on opposing sides of the panel 302 beneath the opening 304 near the middle of the panel 302.

Figure 7:
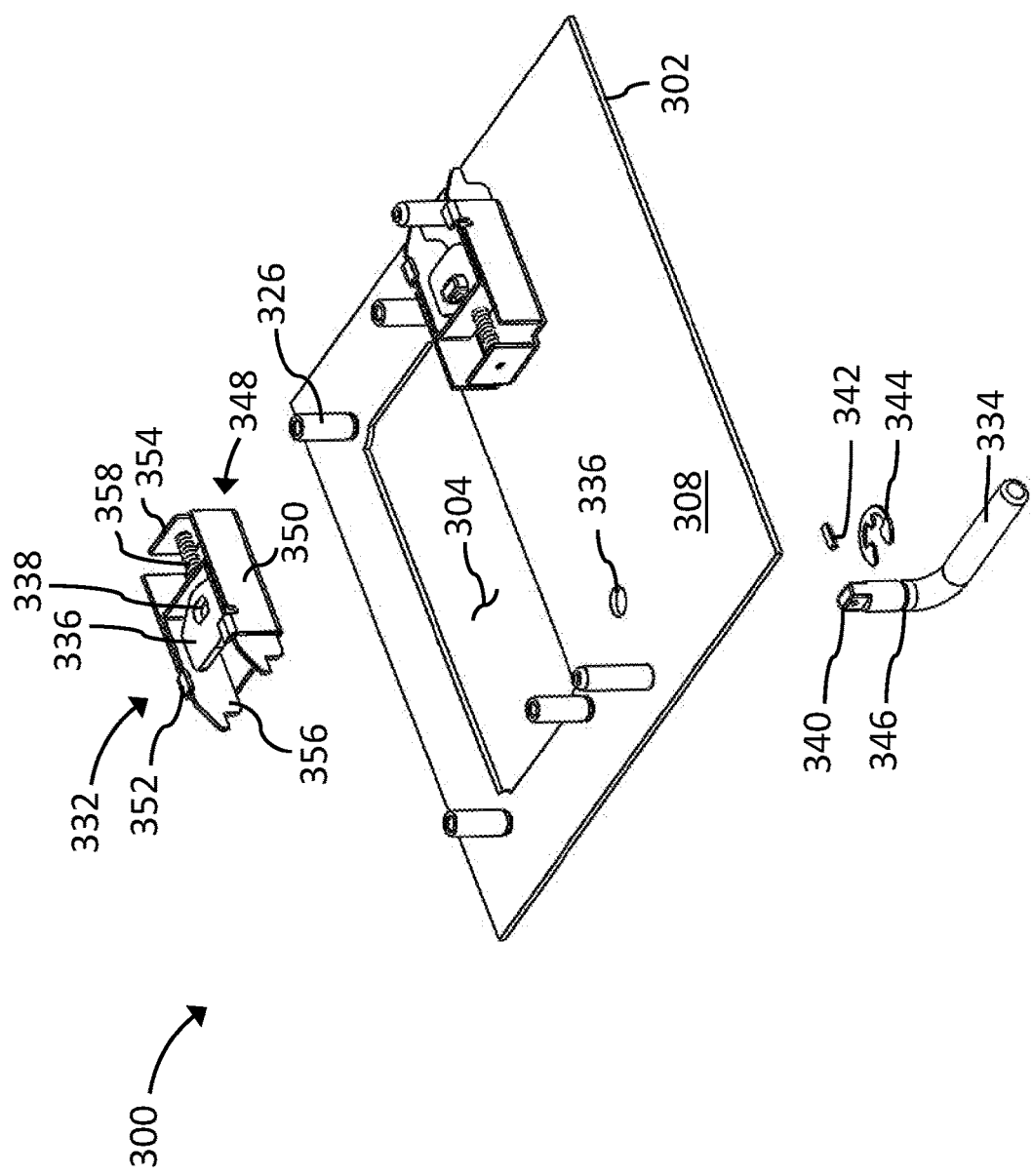

FIGS. 7 and 8 show partially-exploded views of one of the latch assemblies 332 of the cooling assembly 300 and a second of the latch assemblies 332 coupled to panel 302. The latch assemblies 332 include a handle 334 that extends through a hole in the panel 302 when the latch assemblies 332 are assembled and coupled to the panel 302. As such, part of the handle 334 is positioned on the exterior of the enclosure 200 and another part of the handle 334 is positioned in the interior of the enclosure 200.

The handle 334 is coupled to a cam 336. For example, the cam 336 may include a keyhole 338 that is sized and shaped such that an end portion 340 of the handle 334 can extend through the keyhole 338 of the cam 336. In certain embodiments, the handle 334 includes a pin hole, and a pin 342 is positioned in the pin hole such that the handle 334 cannot slide out from the keyhole 338 of the cam 336. A retainer 344 (e.g., a clip such as a C-clip) can be coupled to the handle 334 such that the handle 334 does not slide too far into the hole in the panel 302. The handle 334 can include a slot 346 (shown in FIG. 7) or hole on which the retainer 344 can couple to maintain the position of the handle 334.

FIG. 9 shows an exploded view of one of the latch assemblies 332. The latch assemblies 332 include a latch bracket 348 that is coupled to the panel 302. The latch bracket 348 includes side walls 350 with clip portions 352 and a back wall 354. A latch slide 356 is slidably coupled to the latch bracket 348 and is retained by the clip portions 352 of the side walls 350 of the latch bracket 348. A spring 358 (e.g., a compression spring) or similar biasing device is coupled between the back wall 354 of the latch bracket 348 and the latch slide 356. As will be discussed in more detail below, the spring 358 helps bias the latch slide 356 such that the latch slide 356 can help couple the cooling assembly 300 to the back wall 206D of the enclosure 200. As such, the latch assemblies 332 can be considered to be spring-loaded latch assemblies. A pin 360, bar, or similar feature can be coupled to or extend from the back wall 354 of the latch bracket 348 and extend through a center portion of the spring 358 to guide the spring 358 during assembly and in use.

Figure 12:
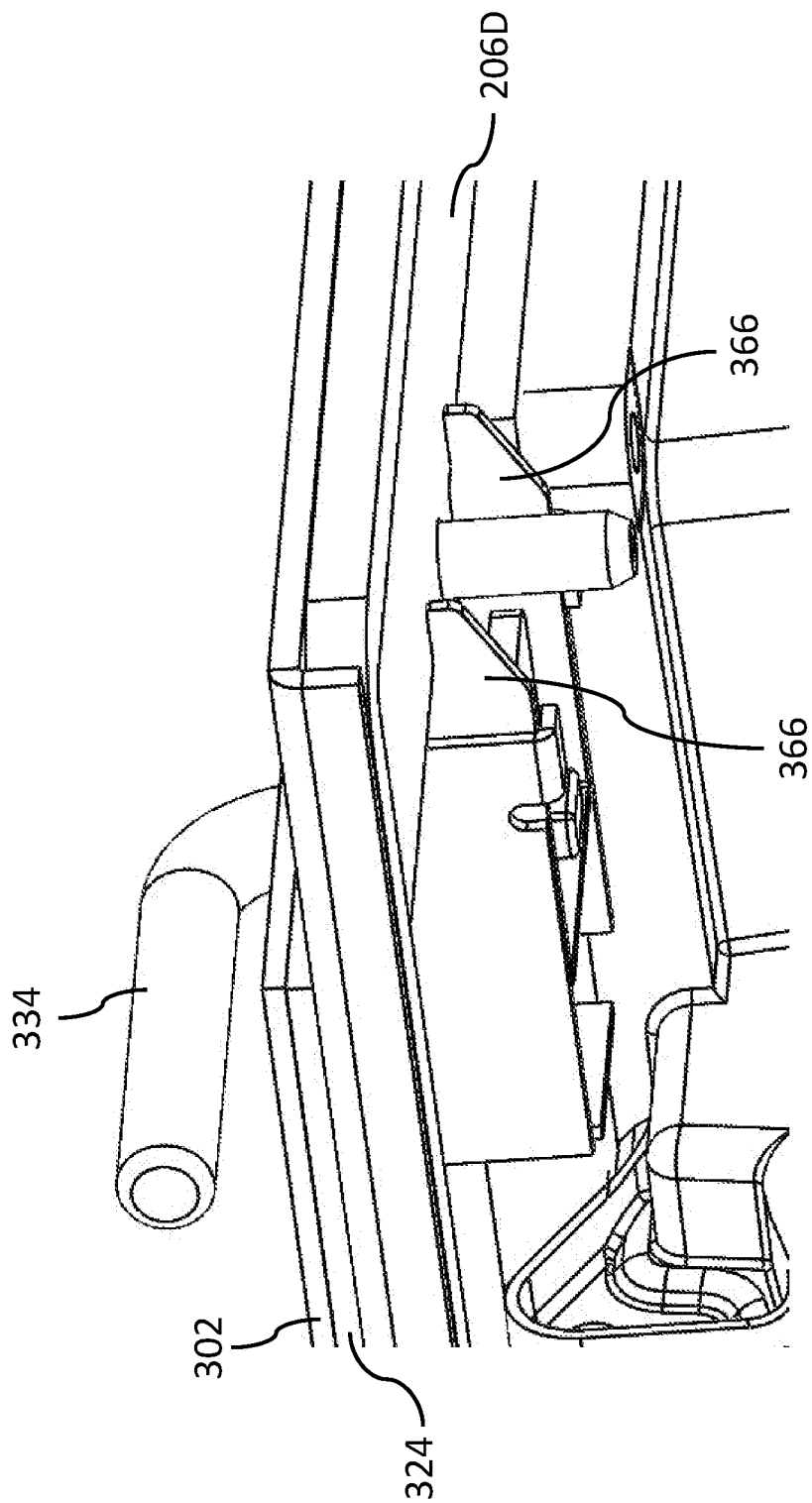
FIG. 12 shows a partial view of the cooling assembly of FIGS. 5-7 coupled to the enclosure of FIGS. 2 and 3, in accordance with certain embodiments of the present disclosure.

The latch slide 356 includes a body 362 with a cam surface 364 and a tip 366. The cam surface 364 is slanted and arranged to contact and slide against the back wall 206D of the enclosure 200 as the cooling assembly 300 is coupled to the back wall 206D. For example, as the cooling assembly 300 is being inserted into the mounting opening 214 of the back wall 206D, the cam surface 364 contacts the back wall 206D and the latch slide 356 compresses the spring 358 until the tips 366 of the latch slide 356 slide past the back wall 206D. After the tips 366 of the latch slide 356 slide past the back wall 206D, the force of the spring 358 urges the latch slide 356 such that a latching surface 368 of the latch slide 356 contacts the back wall 206D. As shown in FIG. 4 and in FIG. 12, the tips 366 of the latch slides 356 at least partially extend past the periphery of the panel 302 to help couple the cooling assemblies 300 to the back wall 206D of the enclosure 200.

Figure 11:
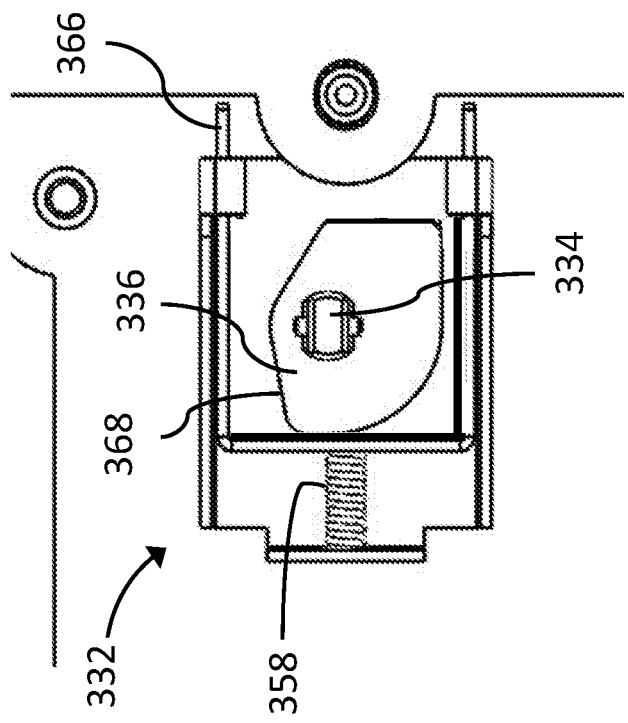
FIGS. 10 and 11 show views of the latch assembly of FIGS. 8 and 9, in accordance with certain embodiments of the present disclosure.
Figure 10:
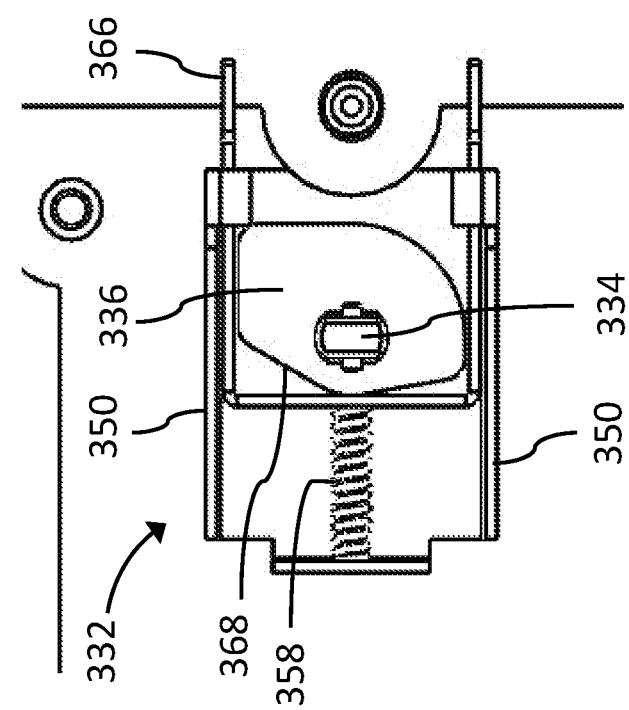

FIG. 10 shows one of the latch assemblies 332 in the latch position, and FIG. 11 shows one of the latch assemblies 332 in the unlatch position.

In the latch position, the handle 334 is positioned such that the cam 336 is positioned to permit the tips 366 of the latch slide 356 to at least partially extend past the periphery of the panel 302. As noted above, the spring 358 biases the latch slide 356 towards the latch position. As such, in the latch position, the spring 358 is compressed less than in the unlatch position.

In the unlatch position shown in FIG. 11, the handle 334 is positioned (e.g., rotated) such that the cam 336 retracts the latch slide 356 inwards such that the tips 366 of the latch slide 356 do not extend past the periphery of the panel 302. As shown in FIGS. 10 and 11, the handle 334 can be rotated to cause the cam 336 to rotate which causes the latch slide 356 to slide linearly along the latch bracket 348 between the latch position (FIG. 10) and the unlatch position (FIG. 11).

The cam 336 includes a cam surface 364 that slides along the latch slide 356 as the handle 334 (and therefore the cam 336) rotates. As the cam 336 rotates in the unlatch position, the cam surface 364 pushes against the latch slide 356 such that the latch slide 356 slides along the latch bracket 348 and compresses the spring 358.

Although the handle 334 is shown as rotating approximately 90 degrees to move the latch assembly 332 between the latch position and unlatch position, the cam 336 can be designed to reduce or increase the amount of rotation required to move the latch assembly 332 between the latch position and unlatch position.

When the cooling assemblies 300 are coupled to the back wall 206D of the enclosure 200, the back wall 206D is positioned between the panel 302 and at least a portion of the latch assemblies 332 on either side of the panel 302. Further, when the cooling assemblies 300 are coupled to the back wall 206D of the enclosure 200, the gasket 324 is positioned between the panel 302 and at least a portion of the latch assemblies 332 to provide a seal and vibration damping functions.

As described above, the cooling assemblies 300 can be considered to be self-latching (or self-coupling) as well as self-sealing. The cooling assemblies 300 can be installed to and removed from the enclosure 200 without using tools.

Figure 13:
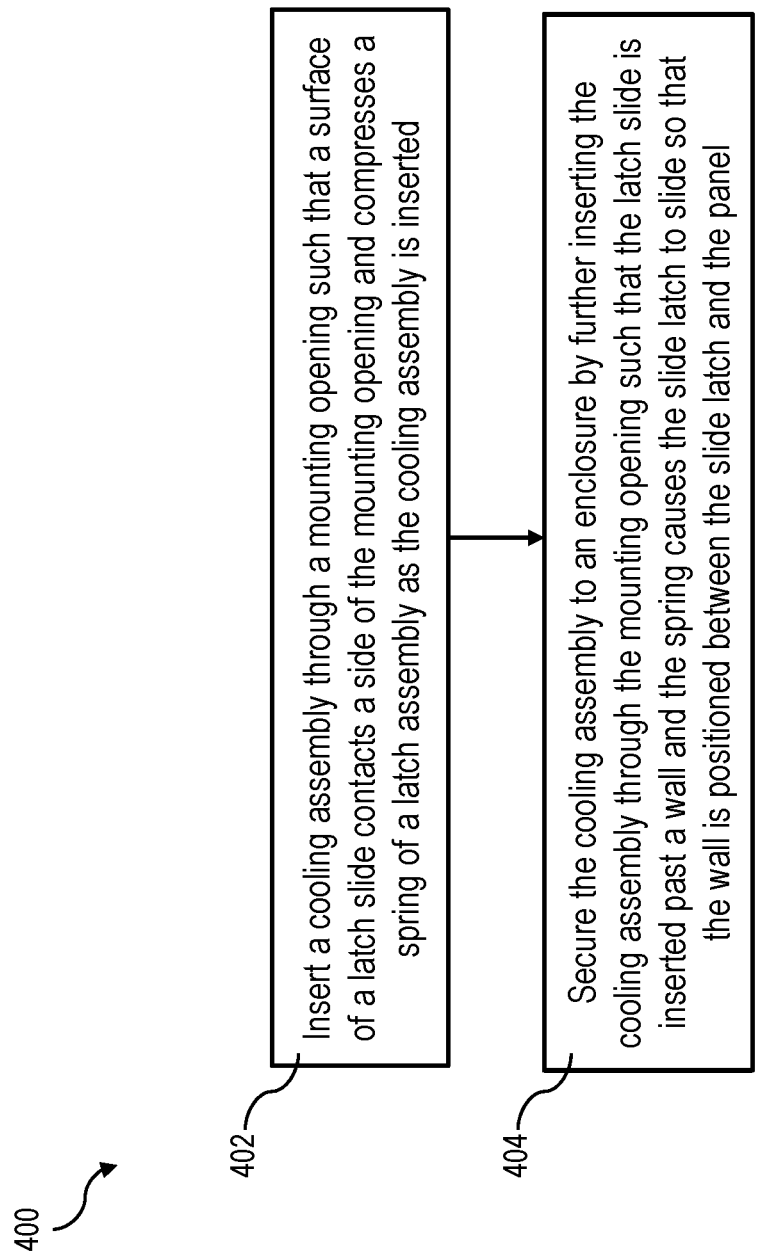
FIG. 13 shows a block diagram of steps of a method, in accordance with certain embodiments of the present disclosure.

FIG. 13 shows a block diagram of a method 400 for using the cooling assembly 300 described above. The method 400 includes inserting the cooling assembly 300 through a mounting opening (e.g., the mounting opening 214 of the back wall 206D) such that a surface of each latch slide 356 contacts a side of the mounting opening and compresses each spring 358 of the latch assemblies 332 as the cooling assembly 300 is inserted (block 402 of FIG. 13). The method 400 further includes securing the cooling assembly 300 to the enclosure 200 by further inserting the cooling assembly 300 through the mounting opening such that the latch slide 356 is inserted past the wall 216 and the spring 358 causes the latch slide 356 to slide so that the wall 216 is positioned between the latch slide 356 and the panel 302 (block 404 in FIG. 13).

Various modifications and additions can be made to the embodiments disclosed without departing from the scope of this disclosure. For example, while the embodiments described above refer to particular features, the scope of this disclosure also includes embodiments having different combinations of features and embodiments that do not include all of the described features. Accordingly, the scope of the present disclosure is intended to include all such alternatives, modifications, and variations as falling within the scope of the claims, together with all equivalents thereof.

I claim:

1. A cooling assembly comprising:
a panel defining an opening;
a cooling unit including an output and coupled to the panel such that the output at least partially covers the opening of the panel; and
spring-loaded latch assemblies are each coupled to the panel and each include a handle that extends through respective holes in the panel, the handles are coupled to respective cams that are arranged to compress or decompress springs of the spring-loaded latch assemblies when the handles are rotated.

2. The cooling assembly of claim 1, wherein the handles are configured to rotate to cause the spring-loaded latch assemblies to move between a latched position and an unlatched position.

3. The cooling assembly of claim 1, wherein the spring-loaded latch assemblies each include a latch slide arranged to slide between a latched position and an unlatched position.

4. The cooling assembly of claim 3, wherein the latch slides are arranged to at least partially extend past an outer periphery of the panel when the spring-loaded latch assemblies are in the latched position.

5. The cooling assembly of claim 3, wherein the latch slide includes a cam surface arranged to contact and slide against a wall as the cooling assembly is coupled to the wall to compress the springs of the spring-loaded latch assemblies.

6. The cooling assembly of claim 3, wherein the respective cams are slidably coupled to the respective latch slides to move the respective latch slides between the latched position and the unlatched position.

7. The cooling assembly of claim 1, further comprising a gasket coupled between the cooling unit and the panel around the opening.

8. The cooling assembly of claim 1, wherein the cooling unit includes a blower.

9. The cooling assembly of claim 1, wherein the handles are at least partially positioned on a first side of the panel, wherein the cooling unit is positioned on a second side of the panel opposite the first side.

10. The cooling assembly of claim 1, wherein the spring-loaded latch assemblies each include a latch bracket and a latch slide arranged to slide with respect to the latch bracket, wherein the respective springs are coupled between the respective latch brackets and the latch slides.

11. The cooling assembly of claim 1, further comprising guide pins coupled to the panel.

12. The cooling assembly of claim 1, further comprising a gasket coupled between the spring-loaded latch assemblies and the panel.

13. A system comprising:
   an enclosure including a wall with mounting openings therethrough; and
   cooling assemblies removably coupled to the wall, each cooling assembly including:
      a panel defining a panel opening,
      a cooling unit including an output and coupled to the panel such that the output at least partially covers the panel opening,
      a spring-loaded latch assembly coupled to the panel and configured to latch and unlatch respective cooling assemblies to the wall, wherein the wall is positioned between the panel and at least a portion of the spring-loaded latch assembly, and
      a handle extending through a hole in the panel and rotatable to latch and unlatch the respective cooling assemblies to and from the wall of the enclosure.

14. The system of claim 13, wherein the handle is coupled to a cam that is arranged to compress or decompress a spring of the spring-loaded latch assemblies when the handle is rotated.

15. The system of claim 14, wherein the spring-loaded latch assemblies each include a latch slide arranged to slide between a latched position and an unlatched position when the handle is rotated.

16. The system of claim 13, wherein the cooling unit at least partially extends through one of the mounting openings of the wall of the enclosure.

17. The system of claim 13, wherein the cooling unit includes a blower.

18. The system of claim 13, wherein the respective cooling assemblies further include a gasket coupled between the cooling unit and the panel around the opening.

* * * * *